(12) United States Patent
Youn et al.

(10) Patent No.: US 7,436,049 B2
(45) Date of Patent: Oct. 14, 2008

(54) LEAD FRAME, SEMICONDUCTOR CHIP PACKAGE USING THE LEAD FRAME, AND METHOD OF MANUFACTURING THE SEMICONDUCTOR CHIP PACKAGE

(75) Inventors: Han-Shin Youn, Cheonan-si (KR); Hyun-Ki Kim, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 142 days.

(21) Appl. No.: 11/047,640

(22) Filed: Feb. 2, 2005

(65) Prior Publication Data

US 2005/0167791 A1    Aug. 4, 2005

(30) Foreign Application Priority Data

Feb. 4, 2004    (KR) .................. 10-2004-0007295

(51) Int. Cl.
H01L 23/495 (2006.01)
H01L 21/00 (2006.01)

(52) U.S. Cl. .............. 257/676; 257/666; 257/667; 257/E23.037; 257/E23.039

(58) Field of Classification Search .............. 257/666, 257/670, 673, 676
See application file for complete search history.

(56) References Cited

U.S. PATENT DOCUMENTS

| | | | | |
|---|---|---|---|---|
| 4,994,411 | A * | 2/1991 | Naito et al. | 29/827 |
| 5,648,682 | A * | 7/1997 | Nakazawa et al. | 257/673 |
| 6,229,205 | B1 * | 5/2001 | Jeong et al. | 257/676 |
| 6,337,510 | B1 * | 1/2002 | Chun-Jen et al. | 257/666 |
| 6,410,365 | B1 * | 6/2002 | Kawata et al. | 438/123 |
| 6,611,047 | B2 * | 8/2003 | Hu et al. | 257/666 |
| 6,876,087 | B2 * | 4/2005 | Ho et al. | 257/778 |

FOREIGN PATENT DOCUMENTS

| | | |
|---|---|---|
| DE | 196 12 392 A1 | 10/1997 |
| JP | 10 050 921 A | 2/1998 |
| JP | 2003-249604 | 9/2003 |
| KR | 1997-0030741 A | 6/1997 |
| KR | 1997-0077602 A | 12/1997 |
| KR | 1998-020297 A | 6/1998 |
| KR | 10-2000-040218 A | 7/2000 |

OTHER PUBLICATIONS

Korean Office Action dated Dec. 26, 2005 and English translation.
German Office Action dated Oct. 5, 2005 (with English-language translation).
Chinese Office Action dated Oct. 19, 2007, for corresponding Chinese Patent Application No. 200510006237.1 (with English-language translation).

* cited by examiner

Primary Examiner—Dao H Nguyen
(74) Attorney, Agent, or Firm—Harness, Dickey & Pierce, P.L.C.

(57) ABSTRACT

A semiconductor chip package with a lead frame having a plurality of leads formed along four sides of the lead frame and tie bars extending from an edge of each of the four sides, wherein bottom surfaces of the tie bars are recessed, a semiconductor chip which is adhered to the recessed surfaces of the tie bars, connectors which electrically connect a plurality of chip pads formed on an upper surface of the semiconductor chip with the plurality of leads, and an encapsulant which encapsulates the upper surface of the semiconductor chip, the connector and bonding portions of the connector.

25 Claims, 8 Drawing Sheets

US 7,436,049 B2

LEAD FRAME, SEMICONDUCTOR CHIP PACKAGE USING THE LEAD FRAME, AND METHOD OF MANUFACTURING THE SEMICONDUCTOR CHIP PACKAGE

PRIORITY STATEMENT

This application claims priority of Korean Patent Application No. 10-2004-0007295 filed on Feb. 4, 2004 in the Korean Intellectual Property Office, the disclosure of which is incorporated herein by reference.

BACKGROUND OF THE INVENTION

1. Field of the Invention

The present invention relates to a lead frame, a semiconductor chip package, and a method of manufacturing the semiconductor chip package. More particularly, the present invention relates to a lead frame, a semiconductor chip package using the lead frame and having an exposed lead frame package (ELP) structure, in which the thickness of the semiconductor chip package is reduced due to the use of the lead frame, and a method of manufacturing the same.

2. Description of the Related Art

Quad flat packaging (QFP) and ball grid array (BGA) packaging techniques may be used when manufacturing semiconductor packages, to electrically and electronically connect a semiconductor chip to an external environment.

A lead frame may be used in manufacturing a QFP. The lead frame may not only serve to provide functions performed by a semiconductor chip to an external circuit through electrically connecting the semiconductor chip to the external circuit, but may also physically support the semiconductor chip.

The lead frame may include a die pad, on which the semiconductor chip may be mounted leads, which may be wire-bonded to chip pads on the semiconductor chip, and a frame, which may support the die pad and the leads.

A QFP generally may have an exposed lead frame package (ELP) structure. A part of a lead frame may be exposed on the outside of a body of the package. In particular, in a QFP with an ELP structure, the die pad and the lower parts of the leads may be exposed to a bottom surface of the body of the package.

A conventional semiconductor chip package may be explained with reference to FIGS. 10 and 11.

FIG. 10 illustrates a plan view of a conventional semiconductor chip package and FIG. 11 illustrates a cross-sectional view taken along a line XI-XI' of FIG. 10.

As illustrated in FIGS. 10 and 11, the semiconductor chip package according to the conventional semiconductor chip package may include a lead frame, a semiconductor chip 50, bonding wires 60, and an encapsulant 70, which may be used in a molding process. The lead frame may include a plurality of leads 10, which may be formed along four sides of the lead frame, a die pad 20, which may be formed in the middle of the lead frame, and tie bars 30, which may extend from the edge of each of the four sides and may be connected to the die pad 20.

An upper surface of the semiconductor chip 50 may be an active surface, on which a plurality of chip pads 51 may be formed, and a lower surface, which may be a non-active surface, may be adhered to an upper part of the die pad 20.

The bonding wires 60 may electrically connect the plurality of chip pads 51 with the plurality of leads 10.

The encapsulant 70 may be formed to encapsulate the semiconductor chip 50 and the bonding wires 60. Bonding portions of the bonding wires 60 may be formed by a molding method using a die. In addition, the bonding portions may be made of an insulating material. Lower surfaces of the plurality of leads 10 (the leads may be completely encapsulated by 70 as illustrated in FIG. 11) and a lower surface of the die pad 20 may not be encapsulated by the encapsulant 70 and may be exposed outside the package.

The semiconductor chip 50 may be mounted on the die pad 20. Because the semiconductor chip 50 may be located on an upper part of the die pad 20, the lengths of the bonding wires 60 connecting the semiconductor chip 50 to the leads 10 may be at least as long as a thickness of the semiconductor chip 50. Thus, electrical characteristics such as high connection resistance may be reduced.

To solve the problems described above, the tie bars 30 and the die pad 20 may be bent downward (as referred to as, down-set) and the semiconductor chip 50 may be adhered to the upper part of the down-set die pad 20 so that the lengths of the bonding wires 60 may be reduced or minimized.

However, the above structure of the package may have a limitation in adjusting the thickness of the package.

Thus, conventionally, the semiconductor chip may have been constructed to have a smaller thickness in order to reduce or minimize the thickness of the semiconductor chip package.

However, as the semiconductor chip is reduced, a wafer may be easily broken during a wafer handling process. As a result, a sawing device for cutting the wafer may not be used.

Further, after manufacturing of the package is complete, the weakened semiconductor chip may be prone to damage by even a small impact.

SUMMARY OF THE INVENTION

Exemplary embodiments of the present invention provide a semiconductor chip package having a reduced or minimized thickness without reducing the thickness of a semiconductor chip.

Exemplary embodiments of the present invention provide a lead frame without a die pad and a semiconductor chip package using the lead frame.

Exemplary embodiments of the present invention provide a method of manufacturing the semiconductor chip package.

In accordance with an exemplary embodiment of the present invention, a semiconductor chip package according to the present invention may comprise a lead frame, which may have a plurality of leads formed along four sides of the lead frame, and tie bars, which may extend from the edge of each of the four sides and in which the bottom surfaces of the tie bars may be recessed, a semiconductor chip, which may be adhered to the recessed surfaces of the tie bars, connectors, which may electrically connect a plurality of chip pads formed on an upper surface of the semiconductor chip with the plurality of leads, and an encapsulant, which may encapsulate the upper surface of the semiconductor chip, the connector and bonding portions of the connector.

In an exemplary embodiment, the tie bars are bent upward to have an up-set structure.

In an exemplary embodiment, the semiconductor chip package may have a total height in a range of about 0.3 to 0.4 mm.

In accordance with another exemplary embodiment of the present invention, there is provided a lead frame, which may comprise a plurality of leads which are formed on four sides of the lead frame, and tie bars, which may extend from the edges of each of the four sides and have bottom surfaces recessed.

In exemplary embodiments, the tie bars may be bent upward to have an up-set structure.

In exemplary embodiments, the lead frame may have a thickness of about 0.18 to 0.22 mm.

In accordance with another exemplary embodiment of the present invention, there is provided a method of manufacturing a semiconductor chip package which may comprise providing a lead frame, which may include a plurality of leads and a plurality of tie bars whose bottom surfaces may be recessed, adhering a semiconductor chip to recessed surfaces of the tie bars so that an active surface of the semiconductor chip may face upward, electrically connecting a plurality of chip pads formed on the active surface of the semiconductor chip with the plurality of leads by connectors, and encapsulating an upper surface of the semiconductor chip, an upper part of the lead frame, the connector, and bonding portions of the connector to expose lower surfaces of the plurality of leads and a lower surface of the semiconductor chip.

After providing the lead frame, in an exemplary embodiment, the method may further comprise up-setting the tie bar using a die so that the tie bar is bent upward.

BRIEF DESCRIPTION OF THE DRAWINGS

The present invention will become more apparent through a description of example embodiments thereof with reference to the attached drawings in which.

DETAILED DESCRIPTION OF EXEMPLARY EMBODIMENTS OF THE INVENTION

Figure 1:
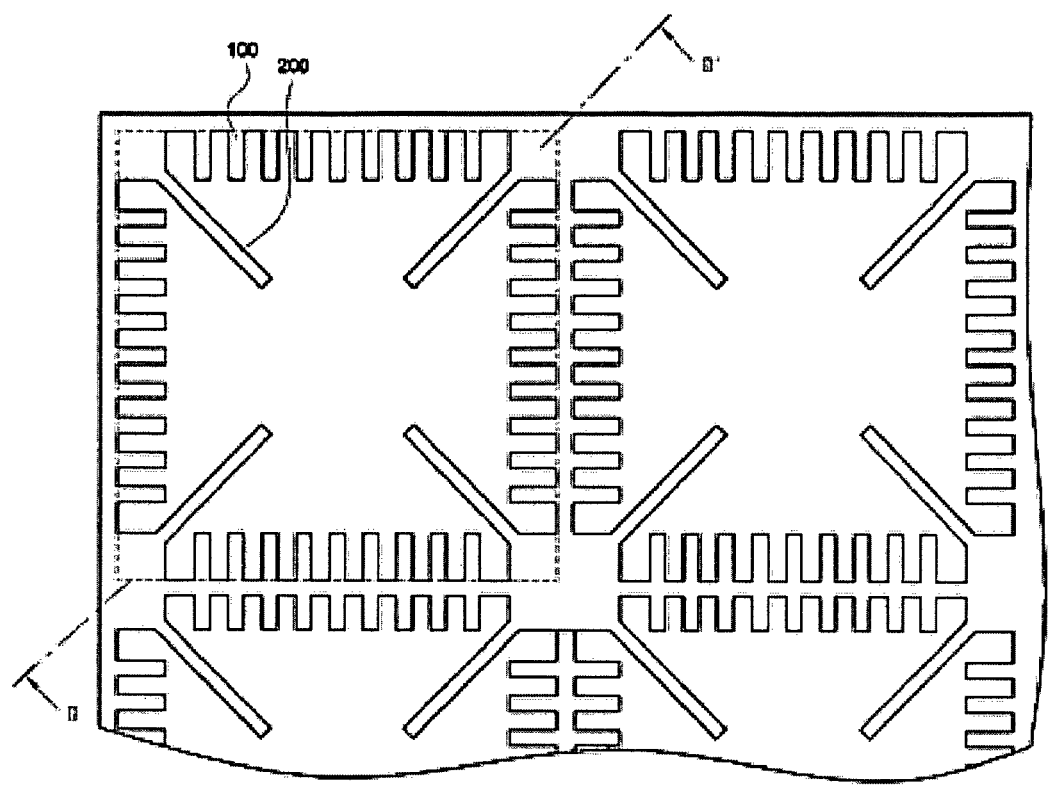
FIG. 1 is a plan view illustrating a lead frame according to an example embodiment of the present invention.

Advantages and features of the present invention and methods of accomplishing the same may be understood more readily by reference to the following detailed description of example embodiments and the accompanying drawings. The invention may, however, be embodied in many different forms and should not be construed as being limited to the example embodiments set forth herein. Rather, these example embodiments are provided so that this disclosure will be thorough and complete and will fully convey the concept of the invention to those skilled in the art, and the present invention will only be defined by the appended claims. Like reference numerals refer to like elements throughout the specification.

Figure 2:
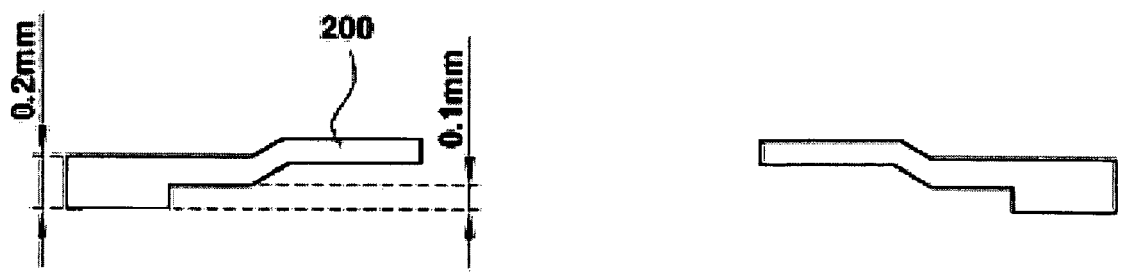
FIG. 2 illustrates a cross-sectional view taken along a line II-II' of FIG. 1.

A structure of a lead frame according to an example embodiment of the present invention is illustrated in reference to FIGS. 1 and 2.

FIG. 1 is a plan view illustrating the lead frame according to an example embodiment of the present invention, and FIG. 2 illustrates a cross-sectional view taken along a line II-II' of FIG. 1.

As illustrated in FIGS. 1 and 2, the lead frame according to the example embodiment of the present invention may be formed by an etch processing and/or press processing of a metal plate. The lead frame may include a plurality of leads 100, which may be formed along four sides of the lead frame, and tie bars 200, which may extend from the edges of each of the four sides.

The tie bars 200 may be formed by a selective etching process, which may be half etching.

For example, when the thickness of the lead frame is 0.2 mm, the bottom surface of each tie bar 200 may be recessed by about 0.1 mm.

Further, the tie bar 200 may be bent upward, that is, the tie bar 200 having the recessed portion may extend from a central portion to a peripheral edge portion in an up-set arrangement such that a thickness of the peripheral edge portion of the tie bar 200 may be less than that of the central portion of the tie bar 200.

This construction may provide a space to enable the semiconductor chip to adhere to the lower surfaces of the tie bars 200.

Because the tie bars may be recessed at their bottom surfaces and may have an up-set configuration, it may be possible to ensure a space in which the semiconductor chip may be able to adhere to the lower surfaces of the tie bars 200 without having to provide a die pad. As a result, the overall size of a semiconductor chip package may be reduced.

Figure 3:
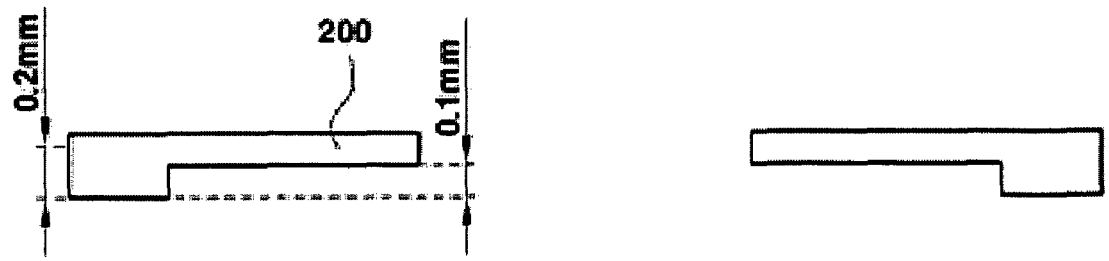
FIG. 3 is a cross-sectional view illustrating a lead frame according to another example embodiment of the present invention.

Next, a structure of a lead frame according to another example embodiment of the present invention is explained in reference to FIG. 3.

FIG. 3 is a cross-sectional view illustrating a lead frame according to another example embodiment of the present invention.

As shown in FIG. 3, the lead frame according to the example embodiment of the present invention may be formed by etch processing and/or press processing of a metal plate in a similar manner as the previous example embodiment. The lead frame may include a plurality of leads which may be formed along four sides of the lead frame and tie bars 200, which may extend from the edges of each of the four sides.

Recess regions may be formed on lower surfaces of the tie bars 200 using half etching and/or a similar process, for ensuring a space for adhering a semiconductor chip.

Therefore, the structure of the lead frame according to the example embodiment of the present invention may be similar to that of the lead frame according to the previous example embodiment of the present invention, except that the tie bars 200 need not be up-set.

A structure of a semiconductor chip package according to the first example embodiment of the present invention is explained in detail with reference to FIGS. 4, 5A and 5B.

Figure 4:
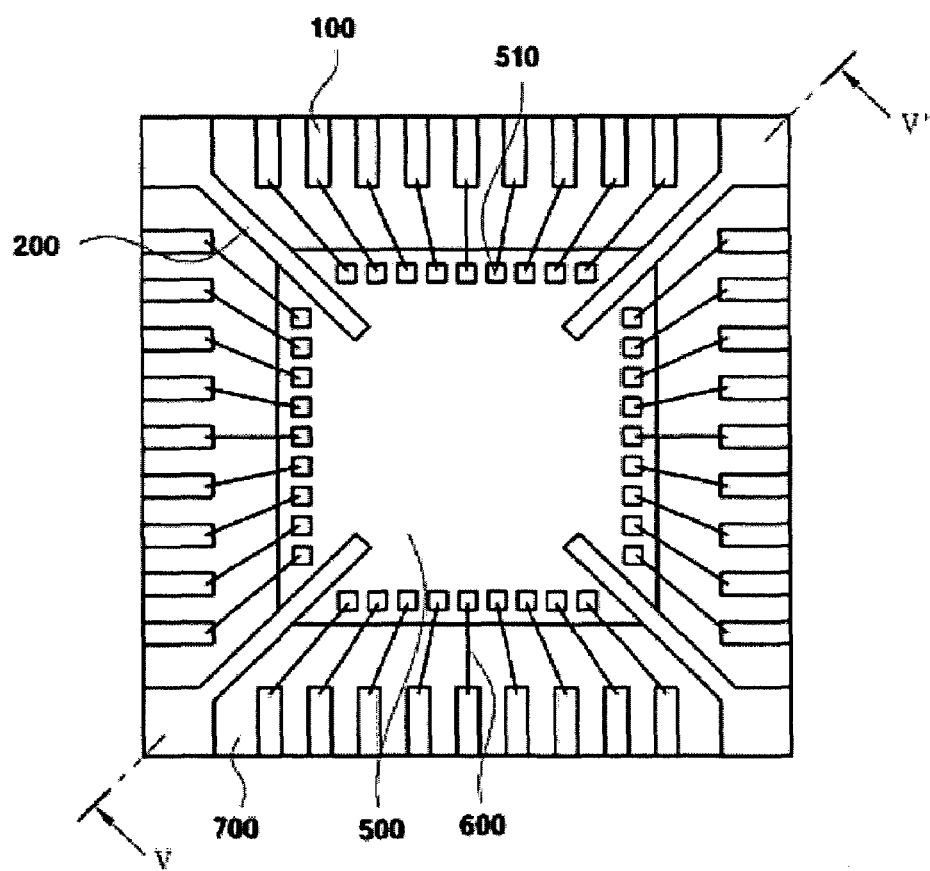
FIG. 4 is a plane view illustrating a semiconductor chip package according to an example embodiment of the present invention.
Figure 5A:
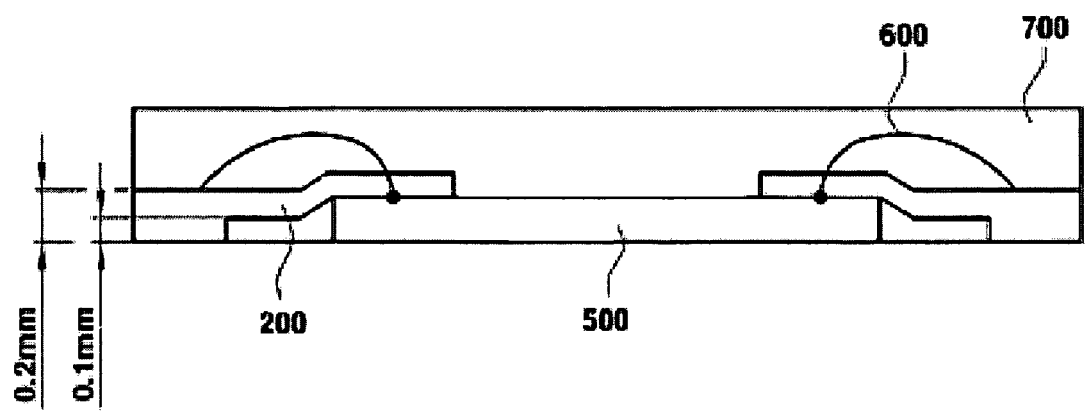
FIGS. 5A and 5B illustrate cross-sectional views taken along a line V-V' of FIG. 4.
Figure 5B:
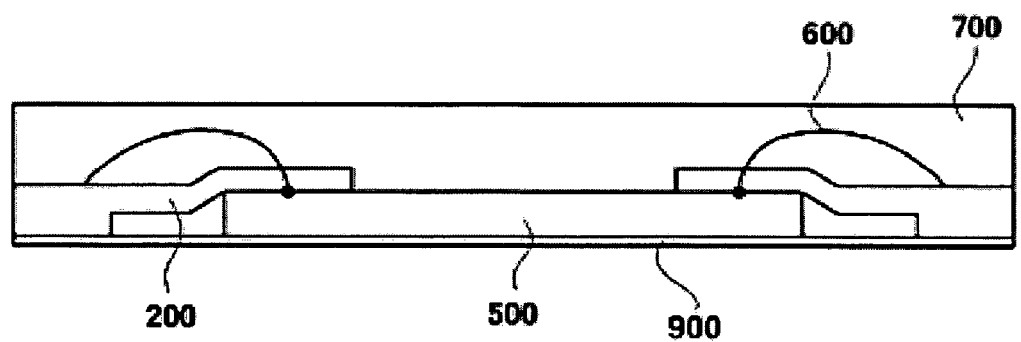

FIG. 4 is a plan view illustrating the semiconductor chip package according to an example embodiment of the present invention, and FIGS. 5A and 5B illustrate cross-sectional views taken along a line V-V' of FIG. 4.

As shown in FIGS. 4, 5A and 5B, the semiconductor chip package according to an example embodiment of the present invention may include the lead frame, a semiconductor chip 500, bonding wire 600, and an encapsulant 700. The lead frame may include a plurality of leads 100, which may be formed along the four sides of the lead frame. Tie bars 200 may also extend from the edges of each of the four sides. The encapsulant 700 may be used in the molding process.

The tie bars 200 of the lead frame may be formed by a selective etching process, which may be half etching. For example, if the thickness of the lead frame may be 0.2 mm, the bottom surfaces of the tie bars 200 may be recessed by about 0.1 mm.

The semiconductor chip 500 may be adhered to the lower etched surface of the tie bar 200. The portions of the tie bars 200, from the middle of the tie bars 200 to the end, to which the semiconductor chip 500 may be adhered, may be bent upward, i.e., up-set, to ensure a space for the semiconductor chip 500 within the package.

An upper surface of the semiconductor chip 500, to which the tie bars 200 may be adhered, may be an active surface on which a plurality of chip pads 510 may be formed. The tie bars 200 may be adhered to edge portions of the active surface of the semiconductor chip 500, on which chip pads 510 may be not formed.

In an example embodiment, the chip pads 510 may have an edge form pad structure, in which the chip pads 510 may be formed along the four sides of the semiconductor chip 500. The chip pads 510 may also have an edge form pad structure, in which the chip pads 510 may be formed on the two sides of the semiconductor chip 500. Further, the chip pads 510 may have a center form pad structure, in which the chip pads 510 may be formed in the center portion of the semiconductor chip 500.

An insulating adhesive may be used to attach the semiconductor chip 500 to the tie bars 200. A liquid-phase, b-stage or film-type adhesive may be used as the insulating adhesive. A b-stage adhesive may be an intermediate state between a liquid state and a solid state.

The bonding wires 600 may electrically connect the plurality of chip pads 510 with the plurality of leads 100. In an example embodiment, the bonding wires 600 may be made of Au, Au—Al alloy, Au—Pd alloy, and the like.

Ball bonds may be formed on the bonding wires 600, which may be bonded to both the chip pads 510 of the semiconductor chip 500 and the leads 100. Further, the ball bonds may be formed on the bonding wires 600, which may be bonded to one of the chip pads 510 and the leads 100, and stitch bonds may be formed on the bonding wires 600 bonded to the other, on which the ball bonds may not be formed. A stitch bond having a stitch shape may be formed by pressing the bonding surfaces of the bonding wires 600 or the like. A ball bond having a ball shape may be formed at the bonding surfaces of the bonding wires 600. The encapsulant 700 may be made of an insulating material such as epoxy molding compound (EMC). Using a molding method, which uses a die, the encapsulant 700 may encapsulate the upper and side surfaces (but not the lower surface) of the semiconductor chip 500, all portions of the lead frame except the lower surfaces of the plurality of leads 100, the bonding wires 600, and bonding portions of the bonding wires 600 encapsulant.

In this case, the upper surface of the semiconductor chip 500, the bonding wires 600, and the bonding portions of the bonding wires 600 need not be encapsulated by the insulating material.

The lead frame may be made of copper and/or copper alloy. In an example embodiment, portions of the lead frame such as the lower surfaces of the leads 100, which are not encapsulated, may be coated with a material, which may be difficult to oxidize and/or may have a high conductivity, such as Sn—Pb alloy, Pd—Au alloy and Ag—Au alloy.

Further, the exposed lower surfaces of the leads 100 may be used to electrically connect an external substrate to the package. The lower surface of the semiconductor chip 500 may be exposed so that heat generated in the semiconductor chip 500 may be effectively dissipated.

As shown in FIG. 5B the heat dissipating effect may be increased by additionally including a heat dissipating device 900, for example, to a lower surface of the semiconductor chip 500. The semiconductor chip package which may have the above-described construction, may have a thickness of 0.3-0.4 mm.

In the semiconductor chip package according to an example embodiment of the present invention, because the semiconductor chip may be accommodated in the lead frame without a die pad and the lower surface of the semiconductor chip is exposed, the thickness of the package may be reduced and/or a heat dissipating effect may be obtained.

A structure of a semiconductor chip package according to another example embodiment of the present invention will now be explained in reference to FIG. 6.

Figure 6A:
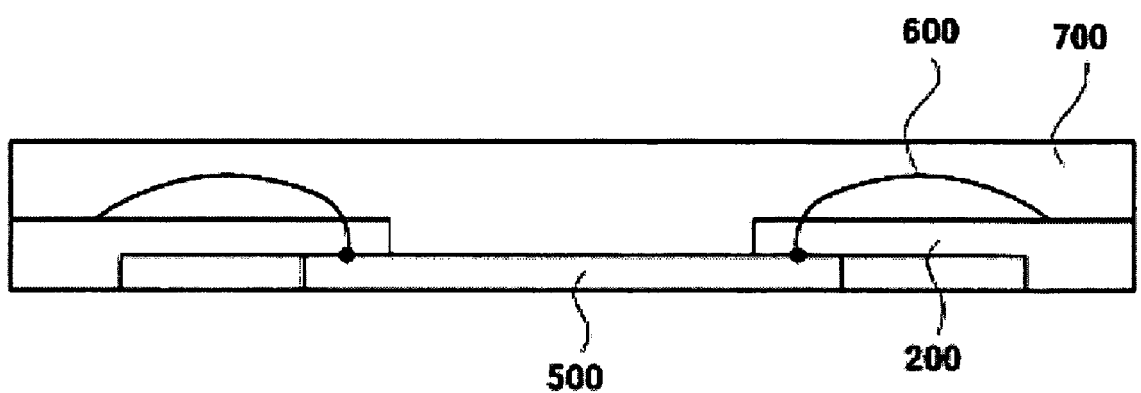
FIGS. 6A and 6B are cross-sectional views illustrating a semiconductor chip package according to an example embodiment of the present invention.
Figure 6B:
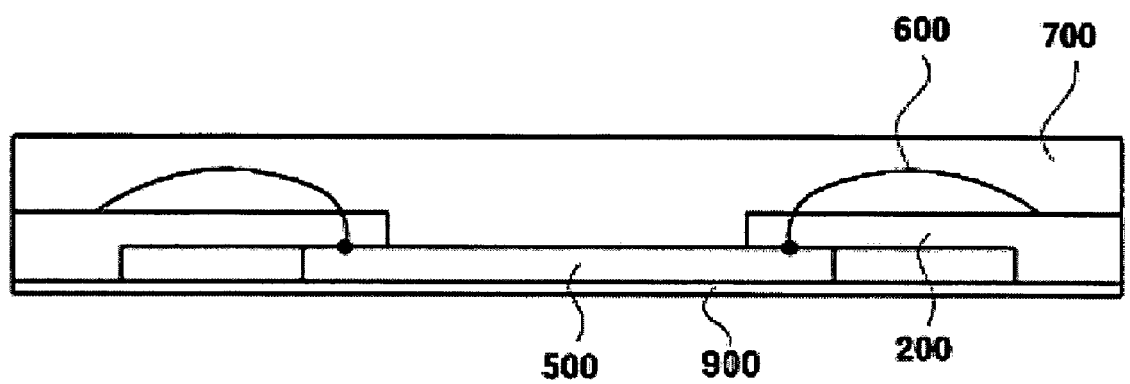

FIGS. 6A and 6B are cross-sectional views illustrating a semiconductor chip package according to another example embodiment of the present invention.

As shown in FIGS. 6A and 6B, the semiconductor chip package according to another example embodiment of the present invention may include a lead frame including a plurality of leads and tie bars 200, a semiconductor chip 500, bonding wires 600, and/or an encapsulant 700.

The semiconductor chip 500 may be adhered to a lower surface of the tie bars 200 of the lead frame. Recess regions may be formed on the lower surfaces of the tie bars 200 by half etching to provide a space for adhering the semiconductor chip 500 within the package.

As shown in FIG. 6B the heat dissipating effect may be increased by additionally including a heat dissipating device 900, for example, to a lower surface of the semiconductor chip 500.

The construction of the semiconductor chip package according to another example embodiment of the present invention may be similar to the previous example embodiment of the semiconductor chip package, except that the tie bars need not be up-set. Therefore, the semiconductor chip package according to the example embodiment of the invention may have similar effects and/or advantages with those of the semiconductor chip package according to the previous example embodiment.

A method of manufacturing the semiconductor chip package according to an example embodiment of the present invention will now be described with reference to FIGS. 7A to 9B and FIGS. 4, 5A and 5B.

Figure 7A:
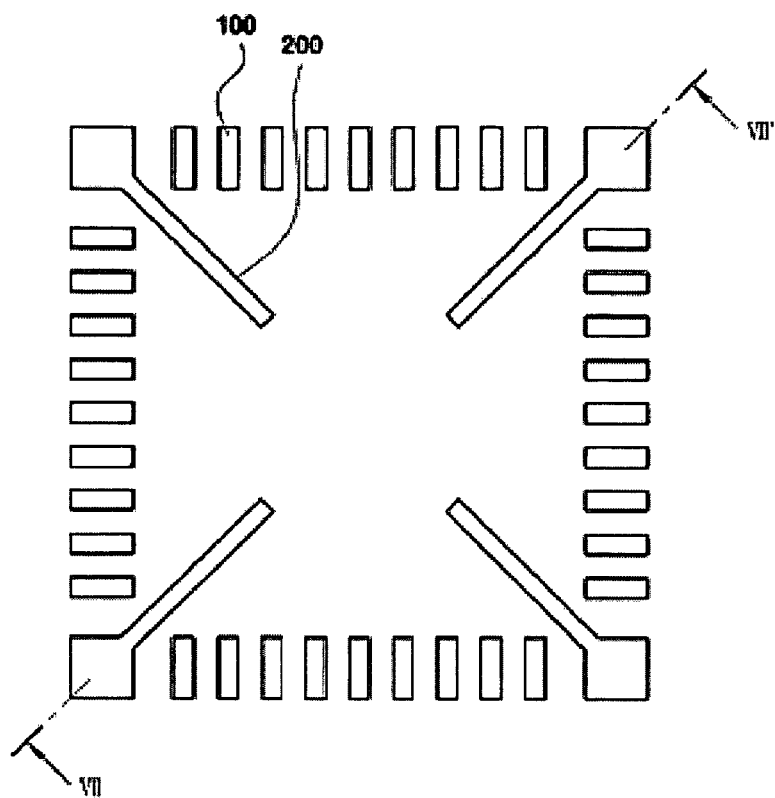
FIG. 7A is a plan view illustrating a first process in the order of formation of the semiconductor chip package according to an example embodiment of the present invention.
Figure 7B:
FIG. 7B illustrates a cross-sectional view taken along a line VII-VII' of FIG. 7A.

FIG. 7A is a plan view illustrating an example process for forming the semiconductor chip package according to an example embodiment of the present invention, and FIG. 7B is a cross-sectional view taken along a line VII-VII' of FIG. 7A.

As shown in FIGS. 7A and 7B, first, the lead frame may be formed. The lead frame may include the plurality of leads 100, which may be formed along four sides of the lead frame, and the tie bars 200, which may extend from the edges of each of the four sides and are formed by etch processing or press processing of a metal plate.

The tie bars 200 may be half-etched by a selective etching process to have a thickness corresponding to about a half of the thickness of the lead frame. By doing so, the recess regions may be formed on the lower surfaces of the tie bars 200.

Figure 8:
FIG. 8 illustrates a cross-sectional view of the semiconductor chip package manufactured in a process subsequent to the process of FIG. 7B.

FIG. 8 illustrates a cross-sectional view of the semiconductor chip package manufactured by a process performed after the process illustrated in FIG. 7B.

As shown in FIG. 8, the portions of the tie bars, from middle of the tie bars 200 to the ends, may be bent upward, i.e., up-set. The up-set portions of the tie bars 200 may be formed by pressing upward on the lower surface of the tie bars 200 using a tool such as a die.

Figure 9A:
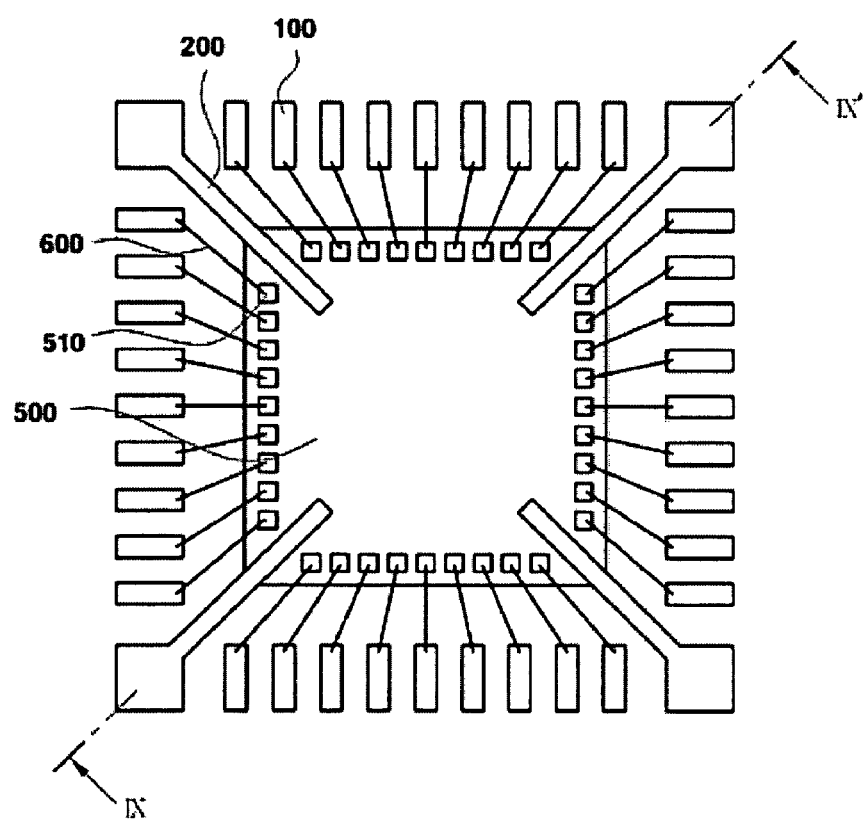
FIG. 9A illustrates a plane view of the semiconductor chip package manufactured in a process subsequent to the process of FIG. 8.
Figure 9B:
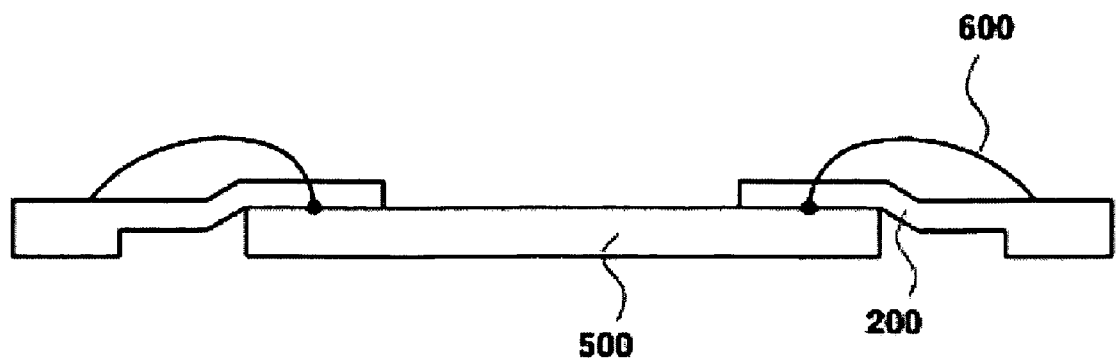
FIG. 9B illustrates a cross-sectional view taken along a line IX-IX' of FIG. 9A.
Figure 10:
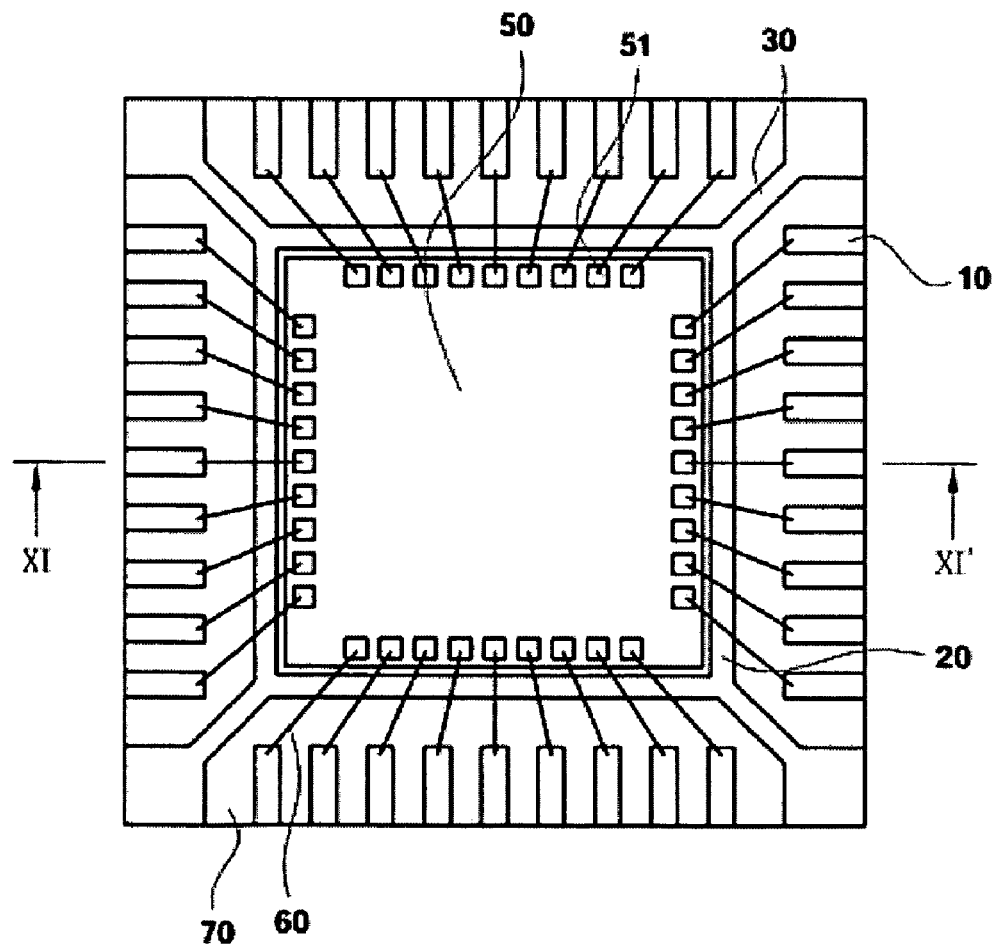
FIG. 10 is a plan view illustrating a conventional semiconductor chip package.
Figure 11:
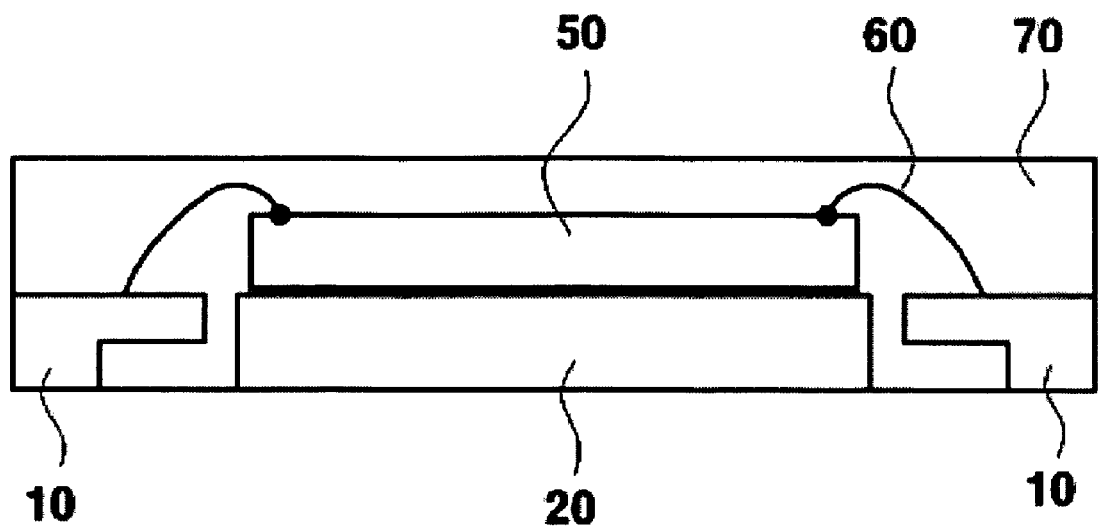
FIG. 11 illustrates a cross-sectional view taken along a line XI-XI' of FIG. 10.

FIG. 9A illustrates a plan view of the semiconductor chip package after having undergone a process followings the process illustrated in FIG. 8, and FIG. 9B illustrates a cross-sectional view taken along a line IX-IX' of FIG. 9A.

As shown in FIGS. 9A and 9B, the semiconductor chip 500 may be adhered to a lower surface of the up-set tie bars using an insulating adhesive.

An upper surface of the semiconductor chip 500, to which the tie bars 200 may be adhered, may be an active surface, on which a plurality of chip pads 510 may be formed. The tie bars 200 may be adhered to edge portions of the active surface, on which the chip pads 510 may be not formed. A liquid-phase, b-stage, or film-type adhesive may be used as the insulating adhesive. For example, the b-stage adhesive may be an intermediate state adhesive between a liquid state and a solid state.

Subsequently, the wire bonding process may be performed using bonding wires 600 to electrically connect chip pads 510, which may be formed on an upper surface of the semiconductor chip 500 to the leads 100. In an example embodiment, the bonding wires 600, for electrically connecting the plurality of chip pads 510 to the plurality of leads 100, may be made of Au, Au—Al alloy, Au—Pd alloy, and/or the like.

Further, ball bonds may be formed on the bonding wires 600, to which both the chip pads 510 of the semiconductor chip 500 and the leads 100 are adhered. The ball bonds may be formed on the bonding wires 600, which may be bonded to one of the chip pads 510 and the leads 100, and the stitch bonds may be formed on the bonding wires 600, which may be bonded to the other on which the ball bonds are not formed.

Referring again to FIGS. 4, 5A, and 5B, using a molding method, which uses a die, the encapsulant 700 may encapsulate upper and side surfaces (but not the lower surface) of the semiconductor chip 500, all portions of the lead frame except lower surfaces of the plurality of leads 100, the bonding wires 600; and bonding portions of the bonding wires 600. The encapsulant 700 may be made of an insulating material such as EMC.

The lead frame may be made of copper or copper alloy. In an example embodiment, portions of the lead frame which are not encapsulated by the epoxy molding resin (EMC) while forming the lead frame may be coated with a material which may be more difficult to oxidize and/or may have a higher conductivity, such as Sn—Pb alloy, Pd—Au alloy and/or Ag—Au alloy.

As described above, although only one package may be shown in the method of manufacturing the semiconductor chip package according to example embodiments of the present invention, a plurality of packages may be generally processed simultaneously in a batch style, for example, manufactured in a strip form and may be separated into individual packages by a singulation process performed thereafter.

A singulation method may be performed by separating processes using die punching and/or a sawing blade, and the like.

While the present invention has been particularly shown and described through exemplary embodiments thereof with reference to the accompanying drawings, it will be understood by those of ordinary skill in the art that various changes in form and details may be made therein without departing from the spirit and scope of the present invention as defined by the following claims. For example, although exemplary embodiments of the present invention illustrate four sides, each including leads and tie bars, leads and tie bars could be placed on fewer than all four sides.

As described above, according to example embodiments of present invention, because the semiconductor chip may be adhered to a lower surfaces of a tie bar having a bottom surface recessed without a need for a separate die pad, a thickness of the semiconductor chip package may be reduced or minimized. Further, the space for accommodating the semiconductor chip may be provided by one or more up-set tie bars. A lower surface of the semiconductor chip may be exposed extremely so that heat dissipation of the semiconductor chip may be improved.

What is claimed is:

1. A semiconductor chip package, comprising:
   a lead frame;
   a semiconductor chip;
   a plurality of connectors; and
   an encapsulant;
   wherein the lead frame comprises:
      a plurality of leads; and
      a plurality of tie bars;
   wherein the semiconductor chip comprises:
      a plurality of chip pads formed on an upper surface of the semiconductor chip;
   wherein the plurality of leads are formed along four sides of the lead frame,
   wherein the tie bars extend from edges of the four sides of the lead frame,
   wherein the tie bars are not electrically connected with the plurality of chip pads,
   wherein portions of bottom surfaces of the tie bars are recessed,
   wherein the semiconductor chip is adhered to the recessed portions of bottom surfaces of the tie bars,
   wherein the plurality of connectors electrically connect the plurality of leads with the plurality of chip pads, and
   wherein the encapsulant encapsulates the upper surface of the semiconductor chip, the plurality of connectors, and bonding portions of the plurality of connectors.

2. The package of claim 1, wherein lower surfaces of the plurality of leads are exposed outside the package.

3. The package of claim 1, wherein a lower surface of the semiconductor chip is exposed outside the package.

4. The package of claim 1, wherein the plurality of tie bars are bent upward to have an up-set structure.

5. The package of claim 1, wherein the plurality of connectors are bonding wires.

6. The package of claim 1, wherein the encapsulant is epoxy molding compound (EMC).

7. The package of claim 1, wherein portions of the lead frame that are not encapsulated are coated with a conductive material.

8. The package of claim 7, wherein the conductive material comprises Sn—Pb alloy, Pd—Au alloy, or Ag—Au alloy.

9. The package of claim 1, further comprising:
a heat dissipating device;
wherein the heat dissipating device is adhered to an exposed lower surface of the semiconductor chip.

10. The package of claim 1, wherein a total height of the package is greater than or equal to about 0.3 mm and less than or equal to about 0.4 mm.

11. The semiconductor chip package of claim 1, wherein the lead frame extends beyond the plurality of leads on each of the four sides of the lead frame.

12. The package of claim 1, wherein portions of the lead frame that are not encapsulated are coated with an antioxidant material.

13. The package of claim 12, wherein the antioxidant material comprises Sn—Pb alloy, Pd—Au alloy, or Ag—Au alloy.

14. The package of claim 1, wherein portions of the lead frame that are not encapsulated are coated with a conductive and antioxidant material.

15. The package of claim 14, wherein the conductive and antioxidant material comprises Sn—Pb alloy, Pd—Au alloy, or Ag—Au alloy.

16. A lead frame, comprising:
a plurality of leads; and
a plurality of tie bars;
wherein the plurality of leads are formed along four sides of the lead frame,
wherein the tie bars extend from edges of the four sides of the lead frame,
wherein the tie bars do not provide paths for electrically connecting a device adhered to the tie bars with an environment external to the lead frame,
wherein portions of bottom surfaces of the tie bars are recessed to accept a semiconductor chip at least partially disposed in the recessed portions, and
wherein the plurality of leads are configured to be electrically connected to a plurality of chip pads on an upper surface of the semiconductor chip.

17. The lead frame of claim 16, wherein the plurality of tie bars are bent upward to have an up-set structure.

18. The lead frame of claim 16, wherein the lead frame has a thickness greater than or equal to about 0.18 mm and less than or equal to about 0.22 mm.

19. The lead frame of claim 16, wherein the recessed portions of bottom surfaces of the tie bars are etched to have a thickness that is less than half a thickness of the lead frame.

20. The lead frame of claim 16, wherein the lead frame extends beyond the plurality of leads on each of the four sides of the lead frame.

21. A lead frame without a die pad, comprising:
a plurality of leads; and
a plurality of tie bars;
wherein the plurality of leads are formed along four sides of the lead frame,
wherein the tie bars extend from edges of the four sides of the lead frame,
wherein the tie bars do not provide paths for electrically connecting a device adhered to the tie bars with an environment external to the lead frame,
wherein portions of bottom surfaces of the tie bars are recessed to accept a semiconductor chip, and
wherein the plurality of leads are configured to be electrically connected to a plurality of chip pads on an upper surface of the semiconductor chip.

22. The lead frame of claim 21, wherein the plurality of tie bars are bent upward to have an up-set structure.

23. The lead frame of claim 21, wherein the lead frame has a thickness greater than or equal to about 0.18 mm and less than or equal to about 0.22 mm.

24. The lead frame of claim 21, wherein the recessed portions of bottom surfaces of the tie bars are etched to have a thickness that is less than half a thickness of the lead frame.

25. The lead frame of claim 21, wherein the lead frame extends beyond the plurality of leads on each of the four sides of the lead frame.

* * * * *